(12) United States Patent
Hohe et al.

(10) Patent No.: US 9,024,622 B2
(45) Date of Patent: May 5, 2015

(54) MAGNETIC FIELD SENSOR CALIBRATABLE DURING MEASUREMENT OPERATION AND METHOD FOR CALIBRATING A MAGNETIC FIELD SENSOR DURING MEASUREMENT OPERATION

(75) Inventors: Hans-Peter Hohe, Heiligenstedt (DE); Michael Hackner, Heman (DE); Markus Stahl-Offergeld, Erlangen (DE)

(73) Assignee: Fraunhofer Gesellschaft zur Foerderung der angewandten Forschung e.V., Munich (DE)

( * ) Notice: Subject to any disclaimer, the term of this patent is extended or adjusted under 35 U.S.C. 154(b) by 1804 days.

(21) Appl. No.: 12/376,750

(22) PCT Filed: Jun. 27, 2007

(86) PCT No.: PCT/EP2007/005690
§ 371 (c)(1),
(2), (4) Date: Sep. 8, 2011

(87) PCT Pub. No.: WO2008/017348
PCT Pub. Date: Feb. 14, 2008

(65) Prior Publication Data
US 2012/0016614 A1    Jan. 19, 2012

(30) Foreign Application Priority Data
Aug. 9, 2006 (DE) .......................... 10 2006 037 226

(51) Int. Cl.
*G01R 35/00* (2006.01)
*G01R 33/02* (2006.01)
(Continued)

(52) U.S. Cl.
CPC ........ *G01R 33/0206* (2013.01); *G01R 33/0017* (2013.01); *G01R 33/0035* (2013.01); *G01R 33/07* (2013.01); *G01R 33/075* (2013.01); *G01R 15/202* (2013.01)

(58) Field of Classification Search
USPC .................................................. 324/202, 225
See application file for complete search history.

(56) References Cited

U.S. PATENT DOCUMENTS

| 6,768,301 B1 | 7/2004 | Hohe et al. |
| 6,879,145 B1 | 4/2005 | Harris |

(Continued)

FOREIGN PATENT DOCUMENTS

| DE | 199431280 | 4/2001 |
| DE | 10150950 | 6/2003 |

(Continued)

OTHER PUBLICATIONS

Schott, et al.; "Integrated 3-D Hall Magnetic Field Sensor"; Jun. 1999; Transducers '99, Digest of Technical Papers, vol. 1, pp. 168-171, Sendai, Japan.

(Continued)

*Primary Examiner* — Jay Patidar
(74) *Attorney, Agent, or Firm* — Perkins Coie LLP; Michael A. Glenn

(57) ABSTRACT

A magnetic field sensor for detecting first, second, and third spatial components of a magnetic field at a reference point includes a first sensor element arrangement for detecting the first magnetic field component having a first measurement field component and a first calibration field component with respect to a first spatial axis at a reference point, a second sensor element arrangement for detecting the second magnetic field component having a second measurement field component and a second calibration field component with respect to a second spatial axis y at the reference point and a third sensor element arrangement for detecting the third magnetic field component having a third measurement field component and a third calibration field component with respect to a third spatial axis x at the reference point. An excitation line is arranged such with respect to the three sensor element arrangements that when impressing a predetermined current into the excitation line respective predetermined calibration field components with respect to the spatial axes in the sensor element arrangements are generated.

19 Claims, 11 Drawing Sheets

(51) Int. Cl.
  *G01R 33/00* (2006.01)
  *G01R 33/07* (2006.01)
  *G01R 15/20* (2006.01)

(56) References Cited

U.S. PATENT DOCUMENTS

| | | |
|---|---|---|
| 7,259,550 B2 | 8/2007 | Bergsma |
| 7,376,527 B2 | 5/2008 | Hikida et al. |
| 2007/0247141 A1 | 10/2007 | Pastre et al. |
| 2011/0187350 A1* | 8/2011 | Ausserlechner et al. ..... 324/202 |

FOREIGN PATENT DOCUMENTS

| | | |
|---|---|---|
| DE | 10150955 | 6/2003 |
| DE | 60206973 T2 | 7/2006 |
| EP | 1637898 | 3/2006 |
| EP | 1698857 A1 | 9/2006 |
| JP | 09-257896 | 3/1997 |
| JP | 2003-508934 A | 3/2003 |
| WO | WO-0118556 | 3/2001 |

OTHER PUBLICATIONS

Popovic; "Hall Effect Devices, Magnetic Sensors and Characterization of Semiconductor"; 1991; Chapters 4 and 5; Adam Hilger, ISBN 0-7503-0096-5.

Schuring, Enrico; "Highly Sensitive Vertical hall Sensors in CMOS Technology"; 2005, reprinted from EPFL Thesis No. 3134 (2004); pp. 184-189; Hartung-Gorre Verlag Konstanz, ISSN 1438-0609, ISBN 3-86628-023-8.

Popovic, et al.; "Three-Axis Teslameter with Integrated Hall Probe Free from the Planar Hall Effect"; Apr. 2006; Proceedings of the IEEE Instrumentation and Measurement Technology Conference, pp. 1812-1815 XP 031057005 Sorento Italy.

Schott, et al.; "Single-chip 3-D silicon hall sensor"; May 15, 2000;10th International Conference on Solid State Sensors and Actuators Jun. 1999 Sendai, Japan XP002465468.

Trontelji, Janez; "Optimization of Integrated Magnetic Sensor by Mixed Signal Processing"; 1999; IEEE pp. 299-302 0-7803-5276-9.

* cited by examiner

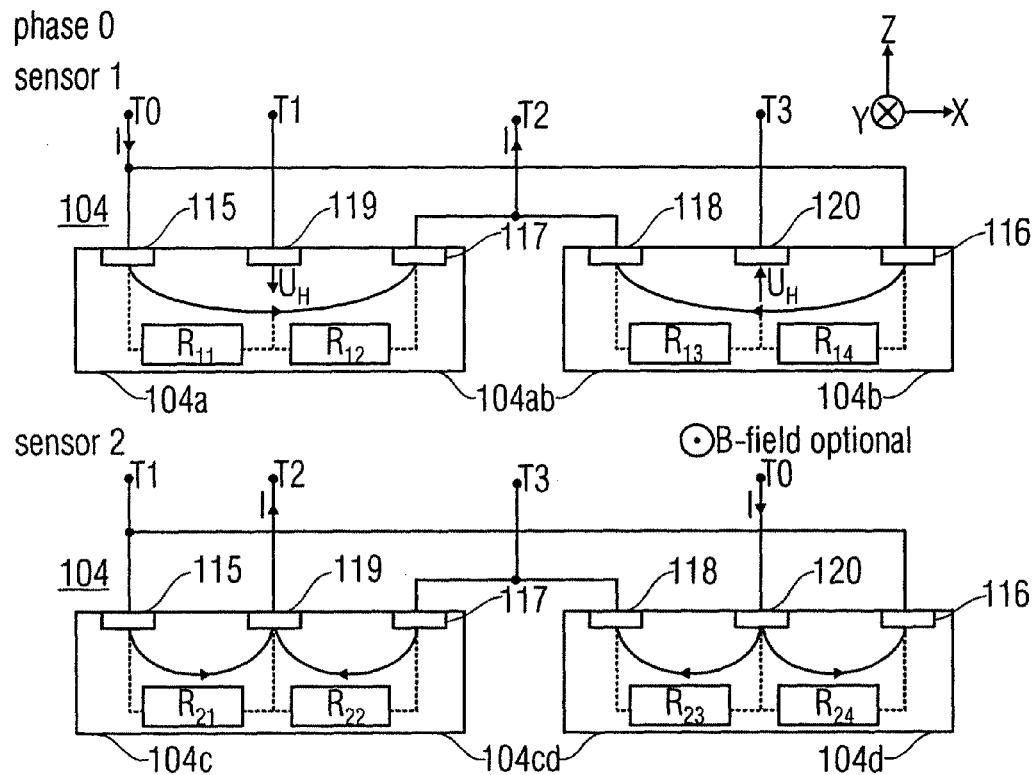
FIGURE 4A I)
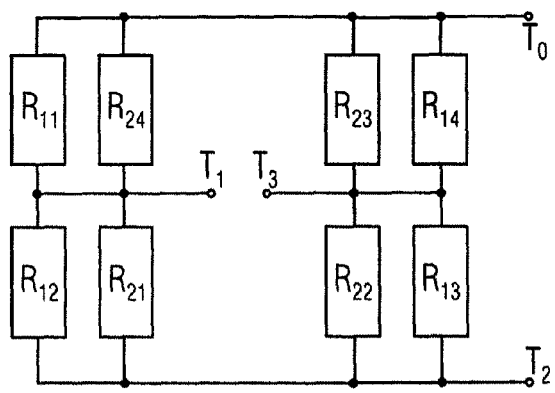
FIGURE 4A II)

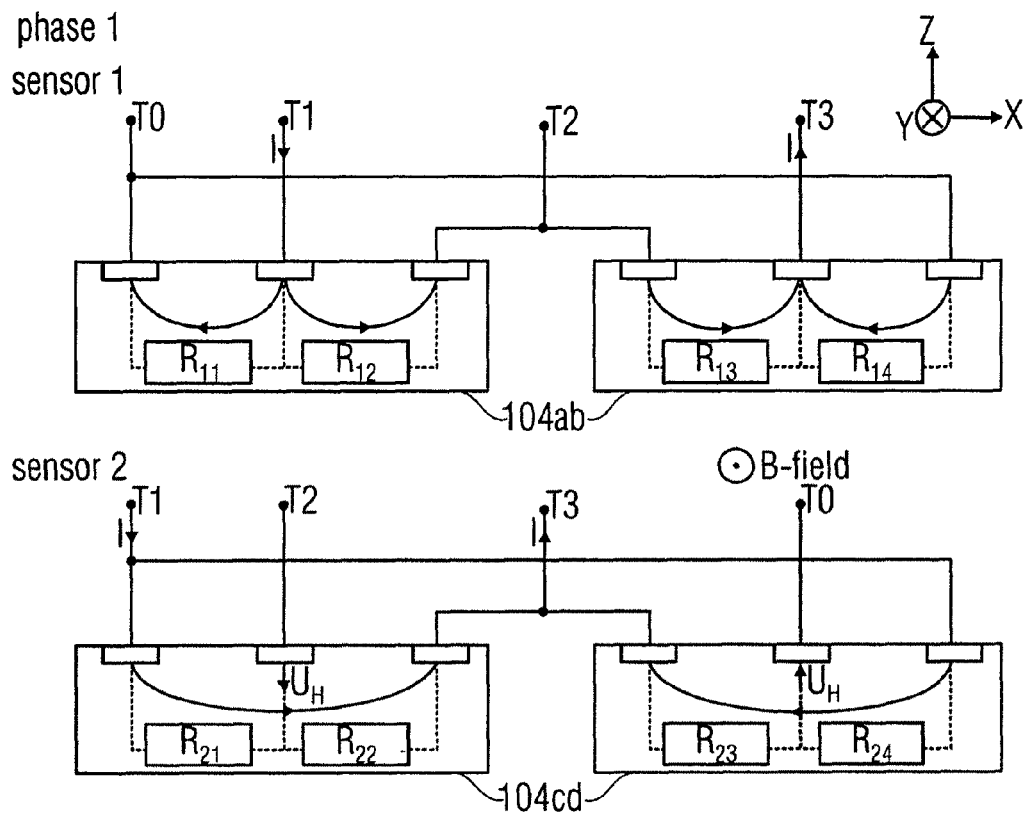
FIGURE 4B I)
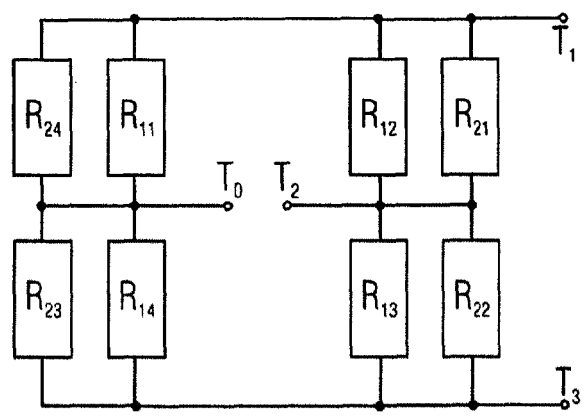
FIGURE 4B II)

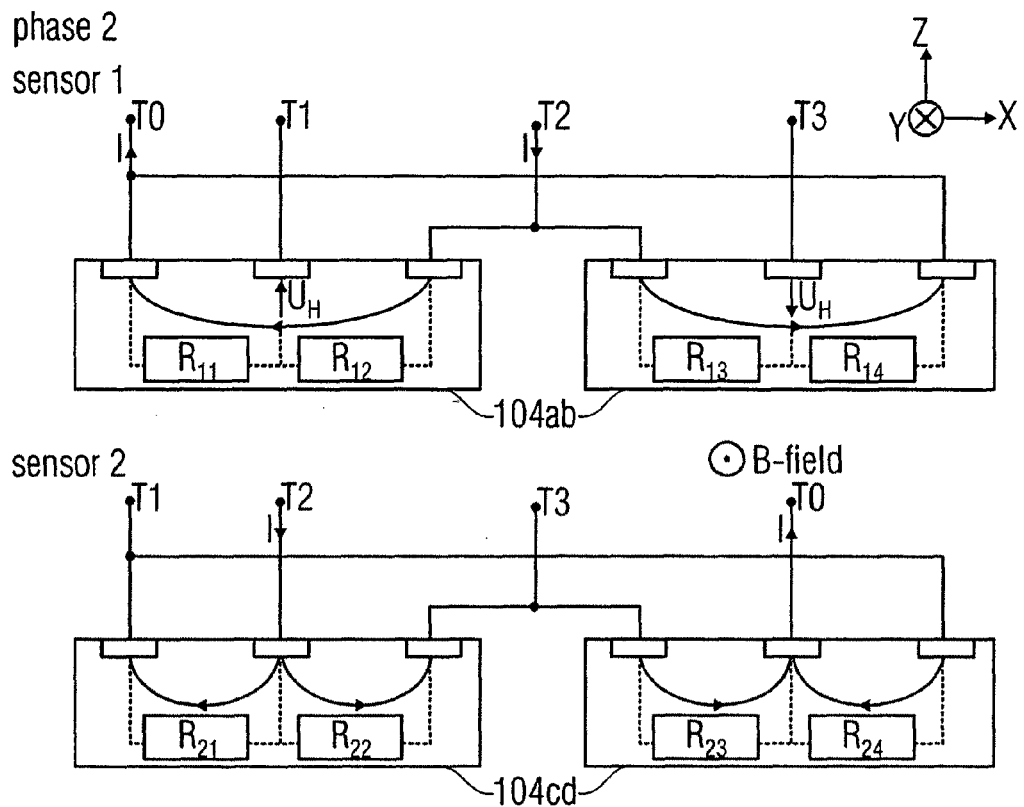
FIGURE 4C I)
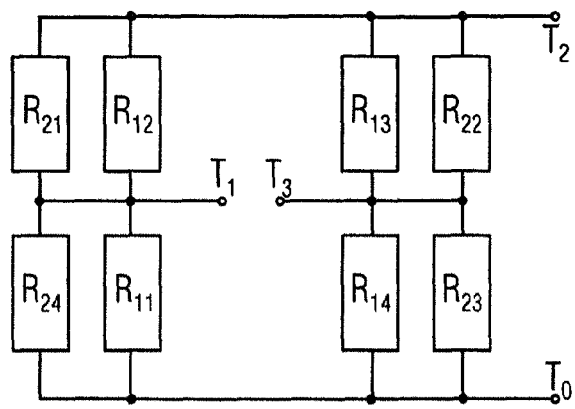
FIGURE 4C II)

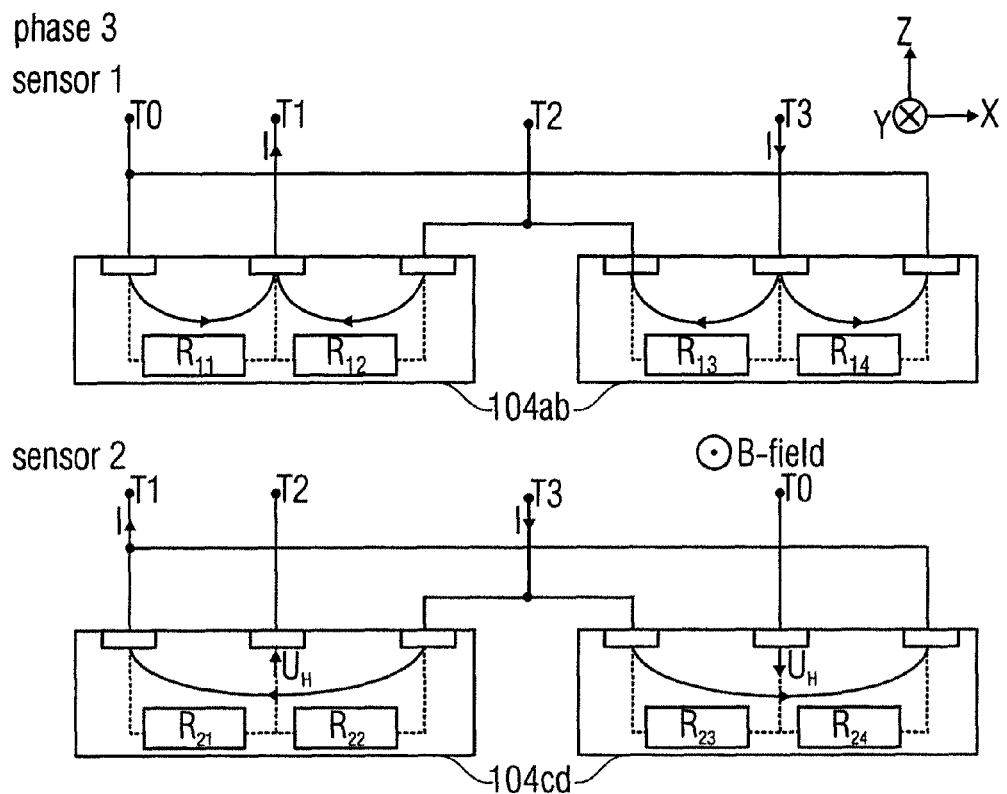
FIGURE 4D I)
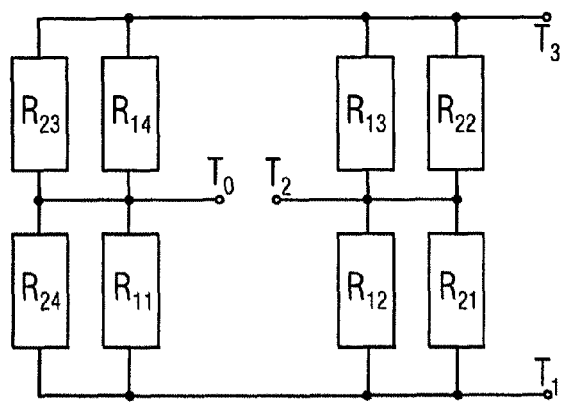
FIGURE 4D II)

MAGNETIC FIELD SENSOR CALIBRATABLE DURING MEASUREMENT OPERATION AND METHOD FOR CALIBRATING A MAGNETIC FIELD SENSOR DURING MEASUREMENT OPERATION

This application is a 371 of PCT/EP07/05690 filed Jun. 27, 2007, claiming priority to German Patent Application No. DE 10 2006 037 226.3 filed Aug. 9, 2011, the contents of which are incorporated herein by reference.

BACKGROUND OF THE INVENTION

The present invention relates to Hall sensors for detecting spatial components of a magnetic field at a reference point, as well as to calibration and measurement methods used therein.

Apart from measuring magnetic fields with regard to amount and direction, Hall sensor elements based on the Hall-Effect are frequently used in the art, for contactless touchless signal generators for wearless detection of the position of switches or actuators. A further possible field of application is current measurement, wherein a Hall sensor element is positioned close to a conductive trace and measures the current in the conductive trace in a contactless manner by detecting the magnetic field generated by the current in the conductive trace. In practical application, Hall sensor elements have particularly shown to be useful due to their relatively strong insensitivity against outside influences, such as contamination, etc.

In the art, both the so-called horizontal or lateral Hall sensor elements and vertical sensor elements are known, wherein FIG. 9a exemplarily shows a horizontal Hall sensor element and FIG. 9b a conventional vertical Hall sensor element.

Generally, a Hall sensor element consists of a semiconductor die having four contact terminals provided for electrical connection to an external control circuit. Of the four contact terminals of a Hall sensor element, two contact terminals are provided for operating current impression by an active semiconductor region, while the other two contact terminals are provided for detecting the Hall voltage. If the operating current-carrying semiconductor die is exposed to a magnetic field having the induction $\vec{B}$, a deviation of the current paths results, which is caused by the "Lorentz force" acting on the moving charge carriers in the magnetic field. The Hall voltage results perpendicular to the direction of the current flow and perpendicular to the applied magnetic field in the active semiconductor region.

As basically shown in FIG. 9a, a conventional horizontal Hall sensor element 900 generally consists of an n-doped semiconductor region 902 on a p-doped semiconductor substrate 904. A Hall sensor element arranged in parallel to a chip surface (x-y-Level) is referred to as horizontal.

The n-doped active region 902 is normally connected to an external control or evaluation logic, respectively, via four contact electrodes 906a-d arranged in the active region 902 in opposing pairs. For reasons of clarity, the control or evaluation logic, respectively, is not illustrated in FIG. 9. The four contact electrodes 906a-d are subdivided into two opposing control current contact electrodes 906a and 906c, which are provided for generating a current flow $I_H$ through the active region 902, and further into two opposing voltage tapping contact electrodes 906b and 906d, which are provided for tapping a Hall voltage $U_H$, which occurs with an applied magnetic field $\vec{B}$ perpendicular to the current flow in the active region 910 and the applied magnetic field, as a sensor signal. By impressing the current flow $I_H$ between different contact electrodes and correspondingly tapping the Hall voltage $U_H$ at the other contact electrodes perpendicular to the current flow, compensation methods can be implemented, which allow the compensation of tolerances occurring in the Hall sensors, for example, due to production tolerances, etc, across several measurement cycles.

As can be seen from the horizontal Hall sensor element 900 illustrated in FIG. 9a, the active region is defined between the contact terminals 906a-d, such that the active region has an effective length L and an effective width W. The horizontal Hall sensor 900 illustrated in FIG. 9a can be produced relatively easily with conventional CMOS-processes (CMOS=Complementary Metal Oxide Semiconductor) for producing semiconductor structures.

Further, apart from the horizontal Hall sensor elements, implementations of the so-called vertical Hall sensor arrangements are known, which also allow the usage of the standard semiconductor production technologies, for example, CMOS-processes. One example of a vertical Hall sensor element 920 is basically illustrated in FIG. 9b, wherein vertical means a level perpendicular to the level of the chip surface (X-Y-level). In the vertical Hall sensor element 920 illustrated in FIG. 9b, the n-doped active semiconductor region 922 extends in the form of a well in a p-doped semiconductor substrate 924, wherein the active semiconductor region 922 has a depth T. As illustrated in FIG. 9b, the vertical Hall sensor element has three contact regions 926a-c, which are bordering on the main surface of the semiconductor substrate 924, wherein the contact terminals 926a-c are all within the active semiconductor region 922. Due to the three contact regions, this variation of vertical Hall sensor elements is also called 3-pin sensor.

Thus, the vertical Hall sensor element 920 illustrated in FIG. 9b has three contact regions 926a-c along the main surface of the active semiconductor region 922, wherein the contact region 926a is connected to contact terminal A, the contact region 926b is connected to contact terminal B, and wherein the contact region 926c is connected to a contact terminal C. If a voltage is applied between the two contact terminals. A and C, a current flow $I_H$ through the active semiconductor region 922 results, and a Hall voltage $U_H$, which is perpendicular to the current flow $I_H$ and the magnetic field $\vec{B}$, can be measured at the contact terminal B. The effective regions of the active semiconductor regions 922 are predetermined by the depth T of the active semiconductor region 922 and the length L according to the distance between the current feeding contact electrodes 926a and 926c.

Horizontal and vertical Hall sensors, as well as the methods for reducing offsets resulting from device tolerances, such as contaminations, asymmetries, piezoelectric effects, aging effects, etc, for example the spinning current method, are already known in literature, e.g. R. S. Popovic, "Hall Effect Devices, Magnetic Sensors and Characterization of Semiconductors", Adam Hilger, 1991, ISBN 0-7503-0096-5. Vertical sensors operated by spinning-current frequently consist of two or four individual sensors, as it is for example described in DE 101 50 955 and DE 101 50 950.

Further, apart from the variation of the 3-pin vertical Hall sensor elements, there are so-called 5-pin vertical Hall sensor elements, which are also described in DE 101 50 955 and De 101 50 950. In the 5-pin Hall sensor elements there is also the possibility of performing a measurement compensated by tolerances of the individual devices with a compensation method extending across several measurement phases, for example, a spinning current method could be used here as well.

The spinning current technique consists of continuously cyclically rotating the measurement direction for detecting the Hall voltage at the Hall sensor element with a certain clock frequency, for example by 90°, and to sum it across all measurement signals of a full rotation by 360°. Thus, in a Hall sensor element having four contact regions, two of which are arranged in pairs, each of the contact pairs is used both as control current contact regions for current feeding and as measurement contact regions for tapping the Hall signal depending on the spinning current phase. Thus, in a spinning current phase or in a spinning current cycle, respectively, the operating current (control current $I_H$) flows between two associated contact regions, wherein the Hall voltage is tapped at the two other contact regions associated to each other.

In the next cycle, the measurement direction is rotated further by 90°, so that the contact regions used for tapping the Hall voltage in the previous cycle are now used for feeding the control current. By summation across all four cycles or phases, respectively, offset voltages caused by production or material approximately cancel each other out, such that only the actually magnetic field dependent portions of the signals remain. This process can also be applied to a larger number of contact pairs, wherein, for example, with four contact pairs (having eight contact regions) the spinning current phases are cyclically rotated by 45°, in order to sum up all measurement signals across a full rotation by 360°.

In horizontal Hall sensors, four sensors are also frequently used, wherein, with an appropriate arrangement, the offset can additionally be heavily reduced by spatial spinning current operation, see e.g. DE 199 43 128.

If a magnetic field is to be measured for several spatial directions, mostly separate Hall sensor elements are used. The usage of separate sensors, for example for detecting the three spatial directions of a magnetic field, generally causes the problem that the magnetic field to be measured is not measured at one point, but at three different points. FIG. 10 illustrates this aspect, wherein FIG. 10 shows three Hall sensors 1002, 1004, and 1006. The first Hall sensor 1002 is provided for detecting a y-spatial component, the second Hall sensor 1004 for detecting a z-spatial component, and the third Hall sensor 1006 for detecting an x-spatial component. The individual sensors 1002, 1004, and 1006 measure the corresponding spatial components of a magnetic field approximately at the respective centers of the individual sensors.

An individual sensor can again consist of several Hall sensor elements. FIG. 10 shows exemplarily three individual sensors having four Hall sensor elements each, wherein in FIG. 10 exemplarily a horizontal Hall sensor 1004 is assumed, which detects a z-component of the magnetic field to be measured, and a vertical Hall sensor 1002 and 1006 each for the y- or x-component of the magnetic field to be measured. The arrangement for detecting the spatial magnetic field components, exemplarily illustrated in FIG. 10, has the problem that the magnetic field cannot be measured at one point, but at the respective centers of the individual sensors. This inevitably causes a corruption, since no exact evaluation of the magnetic field is possible based on the magnetic field components of the magnetic field sensors detected at different positions.

A further aspect of the detection and evaluation of the magnetic fields by Hall sensor elements is the calibration of the individual elements. Conventionally, Hall sensor elements are mostly provided with so-called excitation lines, which allow the generation of a defined magnetic field at the measurement point of an individual sensor, for subsequently obtaining calibration of the sensor by comparing or associating the measured Hall voltage to the defined magnetic field.

Excitation conductors allow the generation of an artificial magnetic field at a Hall sensor, which allows a simple wafer test, i.e. a test directly on the substrate as well as a self-test and a sensitivity calibration during operation, see Janez Trontelj, Optimization of Integrated Magnetic Sensor by Mixed Signal Processing, Proceedings of the 16th IEEE Vol. 1. This is particularly interesting in security critical areas, e.g. in the automobile industry or also in medical technology, since self-monitoring of the sensors is possible during operation.

If, for example, several individual sensors are used for detecting the spatial components of a magnetic field, as exemplarily shown in FIG. 10, every individual sensor necessitates a respective excitation line for calibration, and the individual sensors are further calibrated individually. It follows that the calibration effort scales with the number of individual sensor elements, and, in the case of spatially detecting three magnetic field components, the same is increased three times compared to the calibration effort of an individual sensor.

One approach for allowing an evaluation of a magnetic field, i.e. a measurement at one point, is a 3D sensor of the Ecole Polytechnique Federal Lausanne EPFL, cf. C. Schott, R. S. Popovic, "Integrated 3D Hall Magnetic Field Sensor", Transducers '99, June 7-10, Sensai, Japan, VOL. 1, PP. 168-171, 1999. FIG. 11 schematically shows such a Hall sensor 1100, which is implemented on a semiconductor substrate 1102. First, the 3D sensor has four contact areas 1104*a-d*, across which currents can be impressed in the semiconductor substrate 1102. Further, the 3D sensor has four measurement contact areas 106*a-d*, via which the different magnetic components can be detected. A wiring 1110 is illustrated on the right-hand side of FIG. 11. The shown wiring composed of four operational amplifiers 1112*a-d* evaluates the Hall voltages proportional to the individual magnetic field components and outputs the respective components at the terminals 1114*a-c* in the form of signals Vx, Vy, and Vz.

The illustrated sensor has the problem that the same can only be calibrated by a defined externally generated magnetic field and has no individual excitation line. Further, due to its structure and its mode of operation, this sensor cannot be operated with the compensation method, e.g. spinning current method. Further, another problem of the structure shown in FIG. 11 is that such a semiconductor device has offset voltages due to contamination of the semiconductor material, asymmetries in contacting, variances in the crystal structure, etc., which cannot be suppressed by a respective spinning-current suitable compensation wiring. Thus, the sensor does measure magnetic field components at the focused point, but has a high offset and is thus only suitable for precise measurements in a limited manner. FIG. 12 shows a 3D sensor suitable for compensation (spinning-current), which detects spatial magnetic field components at a measurement point, and which is discussed by Enrico Schurig in "Highly Sensitive Vertical Hall Sensors in CMOS Technology", Hartung-Gorre Verlag Konstanz, 2005, Reprinted from EPFL Thesis N° 3134 (2004), ISSN 1438-0609, ISBN 3-86628-023-8 WW 185 ff. The top part of FIG. 12 shows the 3D sensor of FIG. 10 consisting of three individual sensors. The upper part of FIG. 12 shows the three separate individual sensors 1002, 1004, and 1006 for detecting the spatial magnetic field components. The bottom part of FIG. 12 shows an alternative arrangement of the individual sensors. In this arrangement, the sensor 1004 remains unaltered, since the measurement point of the sensor 1004 is in the center of the arrangement 1200 in FIG. 12, further, the two individual sensors 1002 and 1006 consist of individual elements that can be separated. The sensor 1002 is now subdivided into two sensor parts 1202a and 1202b and arranged symmetrically around the center of the sensor element 1004. An analog method is performed with the sensor 1006, such that the same is also divided into two sensor parts 1206a and 1206b that are arranged symmetrically around the center of the sensor elements 1004, along the respective spatial axis. Due to the symmetrical arrangement of the individual sensor elements, the magnetic field is detected at one point, which lies in the geometrical center of the arrangement. One disadvantage of this arrangement is that the sensor can only be calibrated across several excitation lines. In the following, the arrangement 1200 in the bottom part of FIG. 12 will be referred to as pixel cell without calibration.

SUMMARY

According to an embodiment, a magnetic field sensor calibratable during measurement operation for detecting first, second, and third spatial components $B_z$, $B_y$ and $B_x$ of a magnetic field at a reference point, wherein the magnetic field has first, second, and third measurement field components $B_{Mz}$, $B_{My}$ and $B_{Mx}$, and/or first, second, and third calibration field components $B_{Kz}$, $B_{Ky}$ and $B_{Kx}$, may have: a first sensor element arrangement for detecting the first magnetic field component $B_z$ having a first measurement field component $B_{Mz}$ and/or a first calibration field component $B_{Kz}$, with respect to a first spatial axis z at the reference point; a second sensor element arrangement for detecting the second magnetic field component $B_y$ having a second measurement field component $B_{My}$ and/or a second calibration field component $B_{Ky}$, with respect to a second spatial axis y at the reference point; a third sensor element arrangement for detecting the third magnetic field component $B_x$ having a third measurement field component $B_{Mx}$ and/or a third calibration field component $B_{Kx}$, with respect to a third spatial axis x at the reference point; and an excitation line arranged such with respect to the first, second, and third sensor element arrangements that when impressing a predetermined current into the excitation line, a first predetermined calibration field component $B_{Kz}$ with respect to the first spatial axis x in the first sensor element arrangement is generated, a second predetermined calibration field component $B_{Ky}$ with respect to the second spatial axis y in the second sensor element arrangement is generated, and a third predetermined calibration field component $B_{Kx}$ with respect to the third spatial axis x in the third sensor element arrangement is generated, wherein the three spatial axes z, y, and x run along linearly independent position vectors.

According to another embodiment, a method for calibrating a magnetic field sensor during measurement operation by detecting first, second, and third spatial components $B_z$, $B_y$ and $B_x$ of a magnetic field at a reference point, wherein the magnetic field has first, second, and third measurement field components $B_{Mz}$, $B_{My}$, $B_{Mx}$ and/or first, second, and third calibration field components $B_{Kz}$, $B_{Ky}$ and $B_{Kx}$, may have the steps of: detecting the first magnetic field component $B_z$ having a first measurement field component $B_{Mz}$ and/or a first calibration field component $B_{Kz}$ with respect to the first spatial axis z at the reference point; detecting the second magnetic field component $B_y$ having a second measurement field component $B_{My}$ and/or a second calibration field component $B_{Ky}$ with respect to the second spatial axis y at the reference point; detecting the third magnetic field component $B_x$ having a third measurement field component $B_{My}$ and/or a third calibration field component $B_{Kx}$ with respect to the third spatial axis x at the reference point; and generating the first, second, and third calibration field components $B_{Kz}$, $B_{Ky}$ and $B_{Kx}$ with respect to the first, second, and third spatial axes z, y and x, wherein the first, second, and third spatial axes run along a linearly independent position vector.

Another embodiment may have a computer program having a program code for performing the inventive method when the program code runs on a computer.

The present invention is based on the knowledge that a spatial arrangement of different magnetic field sensors, symmetrical in pairs, which detect the components of a magnetic field at one point, and which can be operated with a compensation method, such as the spinning-current-method, offers the possibility to calibrate the same during operation by applying a calibration field caused by a single excitation line. The inventive magnetic field sensor can be simultaneously in a measurement field and a calibration field, and can be operated in a measurement method consisting of several measurement phases, advantageously spinning-current.

A first combination of the measurement results of the individual phases allows the extraction of a measurement component originating from the magnetic field to be measured, and in which both components originating from the calibration field and components originating from device tolerances are substantially eliminated. Further, a second combination of the measurement results of the individual measurement phases allows the extraction of a measurement component originating from the calibration field and in which components of the magnetic field to be measured are substantially eliminated.

The inventive magnetic field sensor and the inventive method have the advantage that no additional measurement phases are necessitated for calibration when using conventional compensation methods, such as the spinning current method.

An excitation line, which generates calibration field components in all spatial directions due to its geometry is powered, i.e. the calibration field is directed such that the two combinations of the measurement results from the individual measurement phases are enabled in the described way. Thus, generation and direction of the calibration field is adapted to the measurement phases of the compensation method or integrated in the same, respectively. This has the advantage that the arrangement needs only a single excitation line, which results in the inventive magnetic field sensor providing simple and uncomplicated test options. The excitation lines of several inventive magnetic field sensors can, for example, be cascaded and thus be tested together in an on-wafer-test.

It is a further advantage of the inventive magnetic field sensor and method that the magnetic field sensor can be calibrated during operation and that no additional hardware or time effort is necessitated. For example, the measurement results of the individual measurement phases can be combined or evaluated, respectively, by a micro-controller or a processor, so that the additional effort is limited to one additional computation operation. The measurement field components and the calibration field components can each be provided simultaneously and in a compensated manner. This is particularly advantageous in security critical applications, for example, such as in the automobile industry or medical technology, since the magnetic field sensor can be continuously calibrated or adjusted, respectively, and its functionality can simultaneously be monitored without having to make compromises with regard to the quality or quantity of a measurement.

BRIEF DESCRIPTION OF THE DRAWINGS

Embodiments of the present invention will be detailed subsequently referring to the appended drawings, in which:

FIG. 4a-d are schematic wirings and equivalent diagrams of Hall sensor elements in an embodiment for illustrating the inventive compensation method;

DETAILED DESCRIPTION OF THE INVENTION

With regard to the following discussion, it should be considered that equal or similar functional elements in the different embodiments have the same reference numbers and are thus interchangeable in the different embodiments illustrated below.

Figure 1:
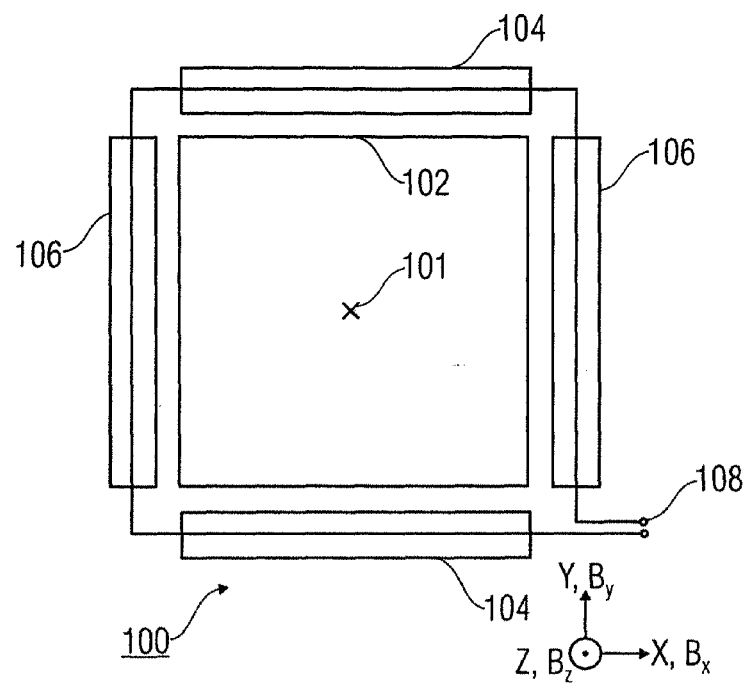
FIG. 1 is a schematic arrangement of Hall sensor elements according to an embodiment of the magnetic field sensor calibratable during measurement operation according to the present invention.

The inventive structure of a magnetic field sensor 100 calibratable during operation according to a first embodiment will be discussed with reference to FIG. 1. FIG. 1 shows an embodiment of an inventive magnetic field sensor 100 for detecting a magnetic field at a reference point 101. Further, FIG. 1 shows a first sensor element arrangement 102, a second sensor element arrangement 104, and a third sensor element arrangement 106. Further, an excitation line 108 is illustrated in FIG. 1.

The magnetic field sensor can, for example, be implemented on a substrate whose main surface runs parallel to the x-y-level of the arrangement, wherein the z-component runs perpendicular thereto. Correspondingly, the magnetic field is divided into three components $B_z$, $B_y$ and $B_x$, each composed of a measurement field component $B_{Mz}$, $B_{My}$ and $B_{Mx}$, and a calibration field component $B_{Kz}$, $B_{Ky}$ and $B_{Kx}$.

As illustrated in FIG. 1, for detecting the first, second, and third spatial components $B_z$, $B_y$ and $B_x$ of a magnetic field with the flow density $\vec{B}$ at a reference point 101, the magnetic field sensor 100 comprises the first sensor element arrangement 102 for detecting the first magnetic field component $B_z$ having the first measurement field component $B_{Mz}$ and a first calibration field component $B_{Kz}$ with respect to a first spatial axis z at the reference point 101. In one embodiment, the sensor element arrangement 102 is realized by a horizontal Hall sensor element whose measurement point is at the reference point 101.

Further, the magnetic field sensor 100 comprises the second sensor element arrangement 104 for detecting the second magnetic field component $B_y$ having the second measurement field component $B_{My}$ and the second calibration field component $B_{Ky}$ with respect to the second spatial axis y at the reference point 101. In one embodiment, the sensor element arrangement 104 is realized by an arrangement of several vertical Hall sensor elements that are arranged in pairs symmetrical to the reference point 101. Further, the magnetic field sensor 100 comprises the third sensor element arrangement 106 for detecting the third magnetic field component $B_x$ having the third measurement field component $B_{Mx}$ and the third calibration field component $B_{Kx}$ with respect to the third spatial axis x at the reference point 101. In one embodiment, the sensor element arrangement 106 is realized by an arrangement of several vertical Hall sensor elements that are arranged in pairs symmetrical to the reference point 101.

The excitation line 108 of the magnetic field sensor 100 is arranged with respect to the first 102, second 104, and third 106 sensor arrangements such that when impressing a predetermined current into the excitation line 108, the first predetermined calibration field component $B_{Kz}$ with respect to the first spatial axis z in the first sensor element arrangement 102 is generated, the second predetermined calibration field component $B_{KY}$ with respect to the second spatial axis y in the second sensor element arrangement 104 is generated, and the third predetermined calibration field component $B_{Kx}$ with respect to the third spatial axis x in the third sensor element arrangement 106 is generated, wherein the three spatial axes z, y, and x run along linearly independent position vectors.

In the embodiment of FIG. 1, the position vectors of the three spatial axes z, y, and x run orthogonally, and the three sensor element arrangements detect the magnetic field according to its orthogonal components $B_z = B_{Mz} + B_{Kz}$, $B_y = B_{My} + B_{Ky}$, and $B_x = B_{Mx} + B_{Kx}$. For simplicity reasons, it is assumed here and in the following description that the magnetic field is detected by orthogonally arranged sensor element arrangements according to its components $B_z$, $B_y$, and $B_x$. In other embodiments of the present invention, the sensor elements can be basically arranged in any direction, as long as they can fully detect the spatial components of the measurement field.

Figure 2:
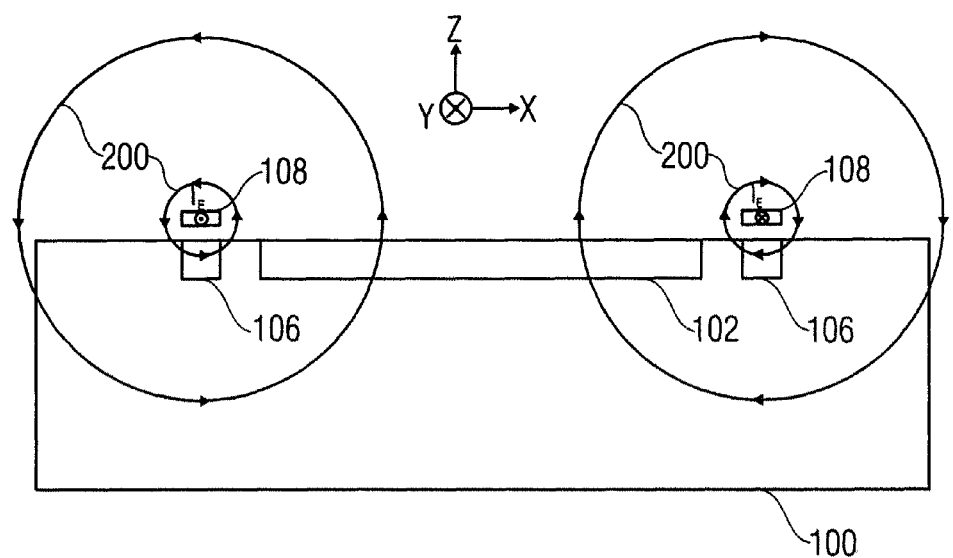
FIG. 2 is a sectional view with schematic magnetic field lines for illustrating the calibration method in the embodiment of the inventive magnetic field sensor.

For illustrating the generation of the calibration field components $B_{Kz}$, $B_{Ky}$, and $B_{Kx}$, FIG. 2 shows a cross-section of the magnetic field sensor 100. In the cross-section illustrated in FIG. 2, the first sensor element arrangement 102 can be seen in the center, as well as a cross-section through the second sensor element arrangement 106, the cross-sections of which can each be seen to the left and right of the first sensor element arrangement 102. Above the second sensor element arrangement 106, with respect to the main surface (x-y-level) of the substrate, runs the excitation line 108. The geometry of the excitation line 108, i.e. its length and dimensions, are selected such that due to a known impressed current, a predetermined magnetic calibration flow density $B_{Kz}$, $B_{Ky}$, and $B_{Kx}$ is present that can be attributed to the excitation line 108. The calibration flow density can be adjusted in a defined manner by the current $I_E$ and the geometry or the properties, respectively, of the excitation line 108, i.e. its height, width, thickness, material, relative position, etc., and the sensor element arrangement can be calibrated by determining and associating the associated Hall voltage. With the known magnetic calibration flow densities, the Hall voltages generated thereby can be associated and thus the magnetic field sensor can become calibratable.

In the illustrated embodiment, it is assumed that a current $I_E$ flows through the excitation line, wherein in the cross-section illustrated in FIG. 2, the current is to flow into the arrangement through the right excitation line 108, and is to flow out again on the left side through the excitation line 108. The current flowing through the excitation line 108 generates a magnetic field, whose field lines are indicated by concentric circles 200 around the excitation line 108 in FIG. 2. It can be seen that the sensor element arrangement 102 is interspersed by all magnetic field lines 200 in the same direction. Further, it can be seen that the cross-sections of the sensor element arrangement illustrated in FIG. 2 are interspersed in the opposite sense by the magnetic field lines 200. Analogously, this applies for the third sensor element arrangement 104, which is not shown in FIG. 2 for clarity reasons, whose constellation is equivalent to the sensor element arrangement 106. The pattern of the field lines 200, as well as the orientation of the field lines 200 by which they intersperse the individual sensor element arrangements, illustrates that a calibration of the sensor element arrangement 102 is possible with the magnetic field generated by the excitation line 108, while the calibration of the second and third sensor element arrangements 104 and 106 necessitates compensation of the oppositely acting field lines.

It can be seen from FIG. 2 that calibration of the magnetic field sensor and detection of the measurement field can take place in different operating phases, during which the excitation current can assume different polarities (directions) and the sensor element arrangements alternately provide Hall voltages. The first 102, second 104, and third sensor element arrangements 106 can be operated in different operating phases, wherein in every operating phase each of the first 102, second 104, and third sensor element arrangements 106 provides a measurement signal attributed to the operating phase, wherein the measurement signals attributed to the operating phases can be combined to a first total measurement value by a first linear combination, such that the influence of the measurement field components is reduced in the first total measurement value, or the measurement signals attributed to the operating phase can be combined to a second total measurement value by a second linear combination, such that the influence of the calibration field component is reduced in the second total measurement value. The influence of the measurement field component or the calibration field component, respectively, in the first or second total measurement value, respectively, can be less than 10%, 1%, or 0.1% of the first or second total measurement value. The operating phases and the detection of the different calibration field or measurement field components, respectively, will be discussed below with reference to a further embodiment and with reference to FIGS. 3 and 4.

Figure 3:
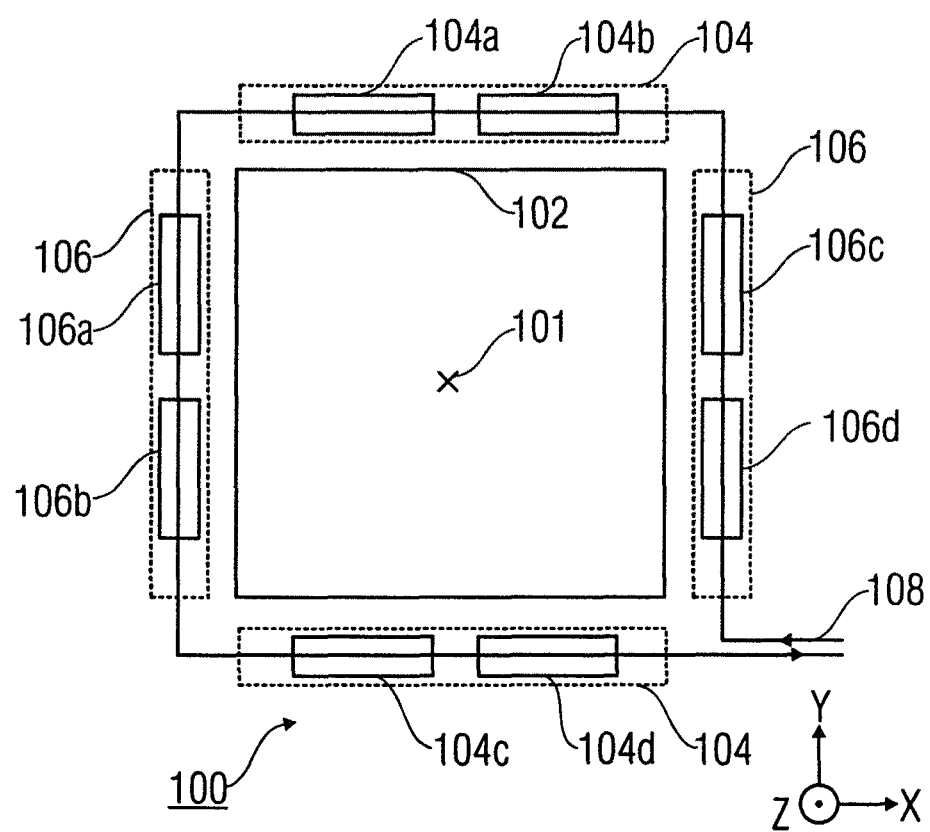
FIG. 3 is a schematic arrangement of Hall sensor elements according to a further inventive embodiment.

For this reason, a further embodiment of the present invention is illustrated in FIG. 3. FIG. 3 shows one embodiment of the inventive magnetic field sensor 100. Analogously, the magnetic field sensor 100 comprises a first sensor element arrangement 102 around a reference point 101, a second sensor element arrangement 104, and a third sensor element arrangement 106. Further, the magnetic field sensor 100 comprises an excitation line 108. In the arrangement shown in FIG. 3, the sensor element arrangements 104 and 106 each have four individual sensor elements that are each arranged in pairs 104ab and 104cd, or 106ab and 106cd, respectively, symmetrical with respect to the reference point 101.

In the embodiment illustrated in FIG. 3, the sensor element arrangements 104 and 106 can be realized, for example, by an arrangement of vertical Hall sensor elements. The second sensor element arrangement 104 in the embodiment in FIG. 3 is composed of four individual sensor elements 104a-d. In the same manner, the third sensor element arrangement 106 is composed of four equal sensor elements 106a-d. The usage of individual sensor elements, such as 104a-d and 106a-d allows wiring the individual elements in a compensation wiring.

FIG. 4 illustrates an inventive wiring of the vertical individual elements and discusses the principle of a compensation concept. FIG. 4aI shows the wiring of four vertical Hall sensor elements, for example, in the second sensor element arrangement 104 with elements 104a-d. In the arrangement shown in FIG. 4aI, vertical 3-pin hole sensor elements are used, which are wired on one axis according to FIG. 3. FIG. 4aI shows two vertical Hall sensors element pairs 104ab and 104cd, wherein the two sensor elements 104a and 104b form the sensor element pair 104ab, and the two sensor elements 104c and 104d form the sensor element pair 104cd. In the considered embodiment, one vertical Hall sensor element pair each forms a sensor for detecting a magnetic field component that is arranged symmetrically around the reference point 101 according to FIG. 3. The sensor element pair 104ab and 104cd detects, for example, the $B_y$ component of the magnetic field.

The two vertical Hall sensor element pairs 104ab and 104cd are identically structured such that that the structure can be discussed below based on the vertical Hall sensor element pair 104ab. The same applies for the Hall sensor element pairs 106ab and 106cd that then detect, for example, the $B_x$ component of the magnetic field. The vertical Hall sensor element pair 104ab consists of two vertical Hall sensor elements 104a and 104b. Every vertical Hall sensor element has three contact areas, wherein in the arrangement of the embodiment considered here, the external contacts 115 and 116, as well as the internal contacts 117 and 118 are electrically coupled to each other, and the contacts 19 and 120 are implemented for detecting the Hall voltage. Overall, as shown in FIG. 4aI, four contact terminals T0-T3 result, by which the two sensor element arrangements 104ab and 104cd are connected in parallel. If a current $I_H$ is impressed between the contact terminals T0 and T2, a Hall voltage $U_H$ can be measured between the contact terminals T1 and T3 when a magnetic field with the respective components is present, as illustrated in FIG. 4aI.

The structure of the second vertical Hall sensor element pair 104cd is identical. Only the contact terminals T0-T3 are shifted by one position with respect to the vertical Hall sensor element pair 104ab, i.e. contacts 115 and 116 are coupled to the terminal T1, contacts 117 and 118 are coupled to terminal T3, contact 119 is coupled to terminal T2, and contact 120 is coupled to terminal T4.

If a current is impressed between the contact terminals T0 and T2 in the vertical Hall sensor element pair 104cd, the arrangement functions as voltage divider and no Hall voltage can be measured between the terminals T1 and T3. A bridge voltage is only measureable between T1 and T3 when device tolerances or inhomogenities, etc. occur. The same applies for the sensor element pair 106ab and 106cd.

FIG. 4aII shows an electrical equivalent diagram of the Hall sensor element pair arrangement of FIG. 4aI. In FIG. 4aI, for illustrative purposes, the respective ohmic resistances between the individual contact terminals T0 and T3 are shown by dotted lines. With regard to the first vertical Hall sensor element pair 104*ab*, a resistance of $R_{11}$ results between the contact area 115 and the contact area 119 connected to the contact terminal T1, a resistance of $R_{12}$ between the contact terminal T1 and the contact area 117, a resistance of $R_{13}$ between the contact area 118 and the contact area connected to the contact terminal T3, and a resistance of $R_{14}$ between the contact area connected to the contact area T3 and the contact area 116. Analogously, the equivalent resistors for the vertical Hall sensor element pair 104*cd* are designated by $R_{21}$, $R_{22}$, $R_{23}$, and $R_{24}$.

FIG. 4*a*II shows the electric equivalent diagram with a parallel connection of the respective terminals T0-T3 of the sensor element pairs 104*ab* and 104*cd*, which corresponds to a Wheatstone-bridge. According to the wiring illustrated in FIG. 4*a*I and with the assumption that no magnetic field is present and a voltage U is applied between the contact terminals T0 and T2, so that a current I is impressed, a voltage of $$U_0 = U\left[\frac{R_{14\|23}}{R_{14\|23} + R_{13\|22}} - \frac{R_{11\|24}}{R_{11\|24} + R_{12\|21}}\right], \tag{1}$$

results between the contact terminals T1 and T3 during a first measurement phase, the measurement phase 0.

FIG. 4*b*I shows the wiring of the two vertical Hall sensor element pairs 104*ab* and 104*cd* during measurement phase 1. A current is impressed between the contact terminals T1 and T3 across the voltage U, such that the vertical Hall sensor element pair 104*ab* now functions as a voltage divider, while the vertical Hall sensor element pair 104*cd* provides a Hall voltage at the terminals t0, T2.

FIG. 4*b*II shows the electrical equivalent diagram of the sensor element arrangement during the measurement phase 1 assuming that no magnetic field is present. For the measurement phase 1, the following results between the terminals T0 and T2

$$U_1 = U\left[\frac{R_{12\|21}}{R_{12\|21} + R_{13\|22}} - \frac{R_{11\|24}}{R_{11\|24} + R_{14\|23}}\right]. \tag{2}$$

Analogously, FIG. 4*c*I shows the arrangement during the measurement phase 2. A current I is impressed across the voltage U between the terminals T2 and T0, such that the vertical Hall sensor element pair 104*cd* functions as voltage divider during measurement phase 2, and the vertical Hall sensor element pair 104*ab* is operated in reverse polarity direction with respect to the measurement phase 0.

FIG. 4*c*II shows the electrical equivalent diagram, again assuming that no magnetic field exists. The following results for this case between the terminals T1 and T3

$$U_2 = U\left[\frac{R_{13\|22}}{R_{13\|22} + R_{14\|23}} - \frac{R_{12\|21}}{R_{12\|21} + R_{11\|24}}\right]. \tag{3}$$

FIG. 4*d*I shows the arrangement of the two vertical Hall sensor element pairs 104*ab* and 104*a* during the measurement phase 3. During the measurement phase 3, a current I is impressed between the contact terminals T3 and T1, such that the vertical Hall sensor element pair 104*ab* functions as voltage divider. Compared to the measurement phase 1, the vertical Hall sensor element pair 104*cd* is operated in reverse polarity direction. FIG. 4*d*II shows the electrical equivalent diagram wherein the following results between the terminals T0 and T2

$$U_3 = U\left[\frac{R_{13\|22}}{R_{13\|22} + R_{12\|21}} - \frac{R_{14\|23}}{R_{14\|23} + R_{11\|24}}\right] \tag{4}$$

The equations 1-4 show that $$U_{H0} + U_{H2} = 0 \tag{5}$$

and $$U_{H1} + U_{H3} = 0, \tag{6}$$

this means that by adding the measured voltages from the individual mass measurement phases possible offset voltages can be compensated. This is also referred to as spinning current, since the current feeding rotates across the contact terminals. Thus, with the described method, deviations resulting from device tolerances, such as contaminations, asymmetries, piezoelectric effects, aging, etc. can be compensated. The equations 1 to 6 show that this is possible for any resistance values, since no assumptions have been made about specific resistance values in the sensor elements.

Further, FIG. 4*a-d* are to illustrate that only one vertical Hall sensor element pair each is active during one measurement phase, while the other is switched as voltage divider. With reference to FIG. 2, this means that during the individual measurement phases, only one side of the sensor element arrangement 106 reacts to the magnetic field lines 200, while the other one functions as voltage divider independent of the currently applied magnetic field.

Thus, in the embodiment according to FIG. 3, vertical S-pin-Hall sensor element pairs are used for implementing the second sensor element arrangement 104 and the third sensor element arrangement 106. The measurement phases described based on FIG. 4*a-d* can be performed independent of the spatial direction of a Hall sensor element. For using the spinning current method when using vertical 3-pin sensors, i.e. for operating vertical 3-pin sensors with a compensation method, two primitive elements have to be used during operation.

According to one embodiment of the present invention, which is illustrated in FIG. 3, two vertical 3-pin-Hall sensor element pairs can be connected in parallel. The same are connected such that two of the same provide the Hall voltage as a sensor, while the other two function as voltage dividers and reduce the offset. For example, a control voltage is applied between the contact terminals T0 and T2 in the measurement phase 0, with reference to FIG. 4*a*I, this causes the formation of the Hall voltage $U_H$ between the contact terminals T1 and T3 in the vertical Hall sensor element pair 104*ab*. The vertical Hall sensor element pair 104*cd* whose contacts are shifted by one phase, operates merely as voltage divider, and makes no contribution to the Hall voltage. The signal of the vertical Hall sensor element pair 104*cd* is only used for reducing the offset.

During the measurement phase 1, the control voltage is applied between the contact terminal T1 and T3. This has the effect that the Hall voltage is now formed at the vertical Hall sensor element pair 104*cd* and the vertical Hall sensor element pair 104*ab* only function as voltage divider. The measurement phase 2 is the equivalent of measurement phase 0, wherein the control voltage is then applied between the contact terminals T2 and T0. The vertical Hall sensor element pair 104*ab* then generates the Hall voltage, whereas the sensor 2 functions again as voltage divider. Analogously, the measurement phase 3 is the equivalent of the measurement phase 1, the control voltage is applied between the contact terminals T3 and T1. Then, the vertical Hall sensor element pair 104ab functions as voltage divider and the vertical Hall sensor element pair 104cd generates the Hall voltage.

Advantageously, 3-pin-Hall sensors are used for sensors within the invention. Basically, any other vertical Hall sensors, e.g. 4-pin, 5-pin, 6-pin, etc. individual sensor elements implemented as vertical Hall sensors can be used within the invention. It is only critical that the same can be operated with different sensitivities in operating phases, or that the different sensitivities can be generated by respective modes of operation. Here, both symmetrically arranged individual sensor elements and symmetrically arranged wirings of individual sensor elements, as has been explained exemplarily with regard to the embodiments of FIG. 4, are possible. For example, in one embodiment of the present invention, 5-pin sensors could be used, wherein one 5-pin individual element each realizes an inventive sensor element arrangement, since 5-pin individual sensor elements can already be operated both in the spinning current mode and with different sensitivities. In this embodiment, the symmetrically arranged 5-pin individual sensor elements are operated simultaneously with different sensitivity, so that the oppositely orientated calibration field components do not fully compensate each other and a calibration field component and/or a measurement field component can be extracted. According to the invention, two symmetrically arranged sensor elements are also suitable for detecting both a measurement field component and a calibration field component in different operating phases that can then be extracted from the individual operating phases by respective combinations of the measurement amounts. Thus, such a sensor can also be calibrated during operation.

For simplifying the description of the inventive concept for detecting spatial components of a magnetic field at a reference point, as well as the calibration and measurement method, the present description refers to a realization of a magnetic field sensor based on vertical 3-pin sensor elements for detecting the y- and x-components of the calibration or measurement field, respectively, and to horizontal sensor elements for detecting the respective z-components. Basically, the inventive magnetic field sensor and the inventive method are also possible by other combinations of different individual sensor elements.

Figure 5:
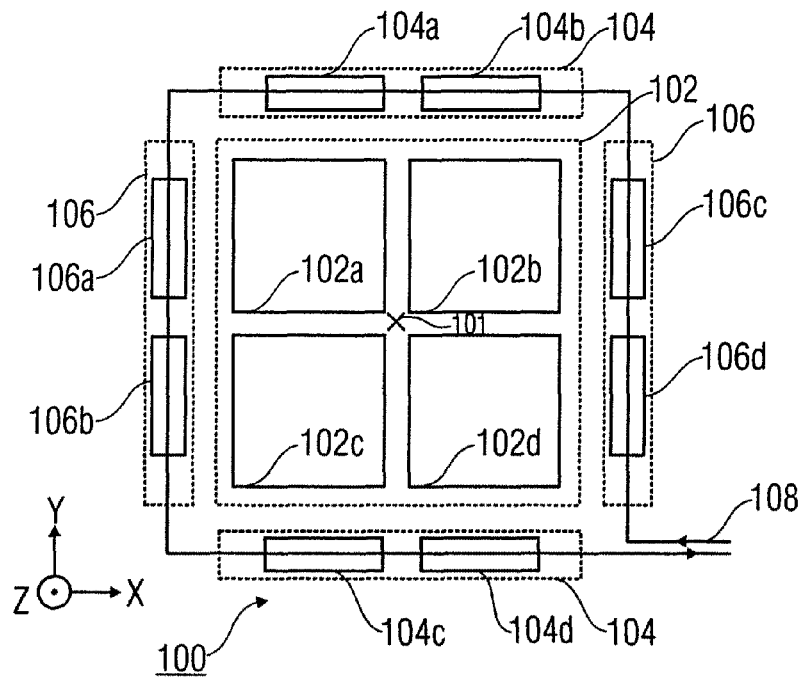
FIG. 5 is an alternative arrangement of the Hall sensor elements according to a further embodiment of the inventive magnetic field sensor.

FIG. 5 shows a further embodiment of a magnetic field sensor 100 according to an alternative embodiment of the present invention. In FIG. 5, the first sensor element arrangement 102, the second sensor element arrangement 104 and the third sensor element arrangement 106 are indicated as dotted lines. Further, FIG. 5 shows the excitation line 108. As has already been discussed with respect to the previous embodiment, individual elements are connected for realizing the three sensor element arrangements 102, 104 and 106. Thus, the second sensor element arrangement 104 and the third sensor element arrangement 106 are realized, for example, by the 3-pin vertical Hall sensor elements and Hall sensor element pairs discussed with regard to FIGS. 4a-d. In FIG. 5, the second sensor element arrangement 104 is realized by the four vertical Hall sensor elements 104a-d, the third sensor element arrangement 106 by the vertical Hall sensor elements 106a-d.

The first sensor element arrangement 102, which has so far been illustrated as realized by a horizontal Hall sensor, has four individual elements 102a-d in the embodiment according to FIG. 5. Thus, the magnetic field sensor 100 illustrated in FIG. 5 is a combination of four horizontal Hall sensors 102a-d and eight vertical 3-pin Hall sensors 104a-d and 106a-d. In one embodiment, the measurement levels measured by the respective sensors are orthogonal to each other, wherein generally the assumption suffices that the measurement levels of the individual sensors run along linearly independent position vectors, so that all spatial magnetic field components can be detected.

In one embodiment in FIG. 4, four vertical 3-pin-Hall sensor elements 104a-d and 106a-d are used for every axis running tangentially to the surface of FIG. 5, wherein all sensors are arranged symmetrically around a center or reference point 101. It is assumed that the vertical Hall sensor elements are connected corresponding to the above description and that the sensors are operated in a spinning current operation according to the above described measurement phases 0 to 3. For explaining the inventive calibratable magnetic field sensors and the calibration method in more detail, the excitation line 108 is also provided with current during the measurement phases.

Figure 6:
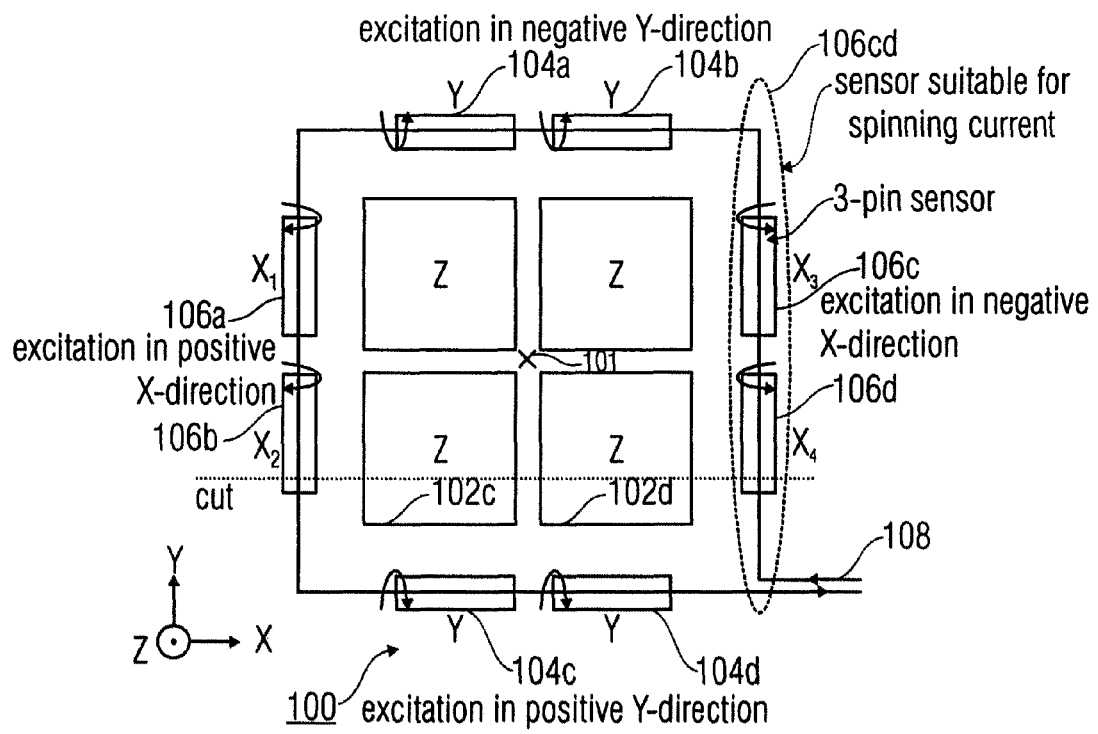
FIG. 6 is a schematic arrangement of the Hall sensor elements according to a further embodiment for illustrating the calibration method.

FIG. 6 again shows the embodiment of a magnetic field sensor 100 of FIG. 5, wherein, for clarity reasons, only the reference numbers relevant for discussing the mode of operation are indicated. In FIG. 6 current flows through the excitation line 108, and thus a calibration field is generated. In FIG. 6, an arrow indicating the direction of the field lines of the calibration field is next to every vertical Hall sensor element. Further, it is assumed that two of the vertical 3-pin-Hall sensors within one Hall sensor element pair, such as the Hall sensor element pair 106c-d in FIG. 6, are operated in a spinning current mode.

Figure 7:
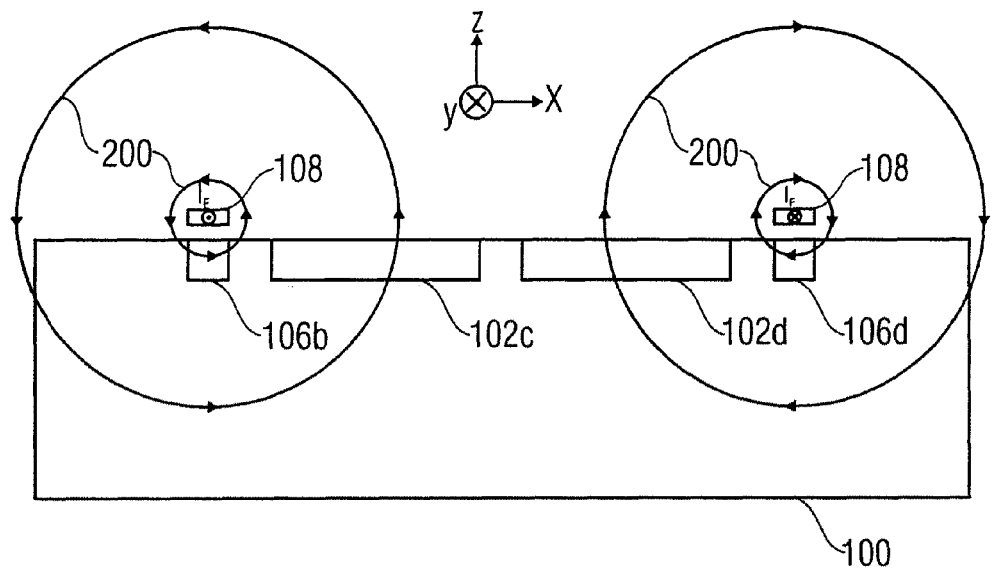
FIG. 7 is a schematic arrangement for illustrating the calibration method according to a further embodiment.

FIG. 7 illustrates again the pattern of the magnetic field lines 200 with regard to the sensor elements 106b, 106d, 102c, and 102d. Excitation with one excitation line does not seem possible at first, since the generated field acts on the vertical Hall sensor elements 106b and 106d in a positive direction at one time, and in a negative direction at another time. Considering the mode of operation of the vertical 3-pin Hall sensor element 106a-d and 104a-d in the spinning current operation, i.e. during the measurement phases 0 to 3, it becomes clear that during one measurement phase, one Hall sensor element pair each functions as voltage divider, and thus detects no magnetic field component.

Since the two vertical Hall sensor element pairs operated in spinning current operation are only active alternately within one sensor element arrangement, it is possible to use a single excitation line 108. The current in the excitation line is switched between the individual measurement phases such that its excitation direction changes and thus excites the Hall sensor element pairs in the same direction in the respectively active state. For the horizontal sensors 102c and 102d, this means that they are excited in a positive direction in one measurement phase and in a negative direction in the other measurement phase. Thus, considering all four phases of the spinning current operation such that the complete sensor becomes operable is necessitated.

The following table illustrates the control of the inventive arrangement, wherein in the column control voltage the terminals of the control current impression are indicated, in the column Hall tapping the terminals where the Hall voltage is tapped, in the column excitation the polarity of the excitation current, in the column Hall voltage the sign of the Hall voltage, and in the last two columns the polarities of the calibration field components of the calibration field:

| Measurement Phase | Control Voltage | Hall Tapping | Excitation | Hall Voltage | Calibr. X/Y | Calibr. Z |
|---|---|---|---|---|---|---|
| 0 | T0-T2 | T1-T3 | + | + | + | + |
| 1 | T1-T3 | T2-T0 | − | + | + | − |
| 2 | T2-T0 | T3-T1 | − | + | − | − |
| 3 | T3-T1 | T0-T1 | + | + | − | + |

The excitation line 108 is fed with a positive current in the measurement phase 0, with a negative current in the measurement phases 1 and 2 and again with a positive current in the measurement phase 3. This has the effect that a Hall voltage can be measured during a running calibration. For the vertical Hall sensor elements 104a-d and 106a-d, a change of sign of the excitation line 108 takes place between the measurement phases 0 and 1, such that the calibration field is applied at the respectively active vertical Hall sensor elements in the same direction. Further, with regard to the vertical Hall sensor elements 104a-d and 106a-d, a change of sign of the calibration field takes place from the measurement phases 0 to 1 to the measurement phases 2 and 3, which results in the calibration field components canceling each other out when adding all four spinning current phases. Since in the case of adding the four measured Hall voltages $U_H$ during the four measurement phases, the actual Hall voltages are added in a sign-correct manner, in this process only the portion that can be attributed to the measurement field remains.

With regard to the horizontal Hall sensor elements 102a-d, the calibration field is applied to all horizontal Hall sensor elements in the same direction. This means that with every change of sign of the current in the excitation line 1208, a change of sign of the respective calibration field components and the attributed measured voltage takes place. This again has the effect that during adding all measurement signals measured in the four spinning current phases, the portions of the calibration field just cancel each other out, whereas the portions of the measurement field overlay in a constructive manner and are thus, in the ideal case, adjusted for the calibration field. In practice, a reduction of the calibration field components to tolerance ranges in the order of less than 10%, 1%, or 0.1% of the total measurement value is possible.

In order to be able to perform calibration during a running measurement, i.e. when the magnetic field sensor is in a magnetic field, the same process is applied. With regard to the vertical Hall sensor elements 104a-d and 106a-d, the calibration field is applied in a positive direction in the measurement phases 0 and 1, whereas the calibration field is applied in a negative direction to the active vertical Hall sensor elements in the measurement phases 2 and 3. The calibration Hall voltage can now be obtained by adding the measurement signals from the first two phases and subtracting the measurement signals of the last two measurement phases. This results in the actual signals to be measured, which means measurement signals attributed to the measurement field, just canceling each other out, whereas only those measurement signals attributable to the calibration field overlap in a constructive manner. With a respective combination of the measurement signals from the individual measurement phases, a calibration-field component can be extracted, even when at the same time a further magnetic field to be measured is present.

With regard to the horizontal Hall sensor elements 102a-d, the calibration field is applied in a positive direction in the measurement phases 0 and 3, and in a negative direction in the measurement phases 1 and 2. The calibration Hall voltage attributable to the calibration field can now be obtained by adding the measurement signals of the measurement phases 0 and 3 and subtracting the measurement signals of the measurement phases 1 and 2. In this case, by respectively combining, a measurement signal, which is merely attributable to the calibration field, can be extracted since in the ideal case, the measurement field components cancel each other out completely. In practice, a reduction of the measurement field components to tolerance ranges in the order of less than 10%, 1%, or 0.1% of the total measurement value is possible.

The measurement signal attributable to the measurement field component results in all these Hall sensors by adding measurement signals measured in the four spinning current measurement phases.

Maximum Hall voltage=sum of the signals of the individual measurement phases 0 to 3.

For extracting the calibration field component, the measurement signals from the four measurement phases or spinning current phases, respectively, are added as follows:

Calibration field component of the vertical sensors=measurement phase 0+measurement phase 1−measurement phase 2−measurement phase 3.

Calibration field component of the horizontal sensors=measurement phase 0−measurement phase 1−measurement phase 2+measurement phase 3.

In principle, it is possible to provide other combination options by reversing the polarity of the excitation current and exchanging the measurement phases. According to the invention, it is generally possible to extract the measurement field component with reduced calibration field component, or the calibration field component with reduced measurement field component, respectively, by different combinations of the measurement signals. It can be seen that the measurement signal component attributable to the measurement field is theoretically eliminated by this linear combination, and only one calibration field component remains. In a practical application, the influence of a measurement field can be significantly reduced by a linear combination of the described type for extracting a calibration field component. By another linear combination, it is possible to mostly suppress the calibration field component for extracting an offset-compensated measurement field component. In practice, a suppression to portions in the order of less than 10%, 1%, or 0.1% of the total measurement value is possible.

Figure 8:
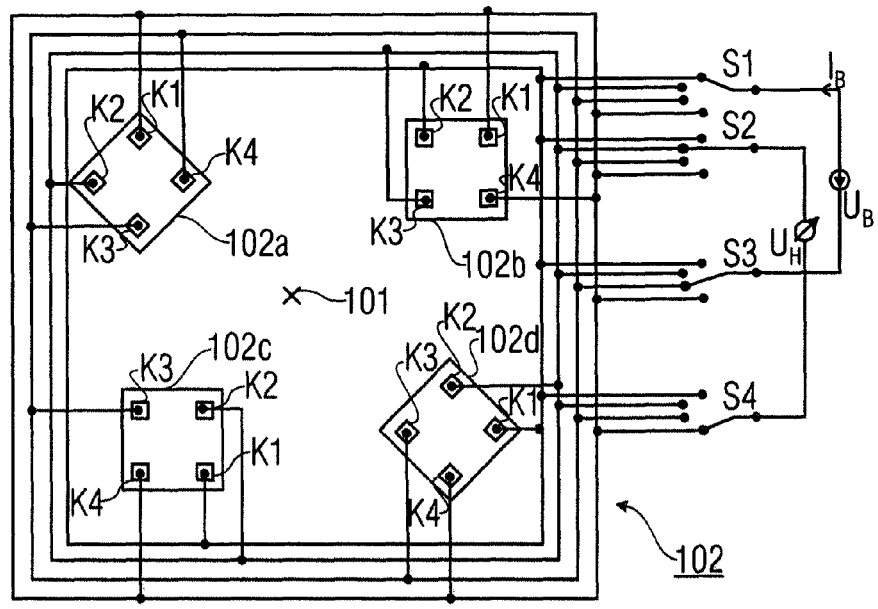
FIG. 8 is an embodiment of an arrangement of several sensor elements for detecting a spatial magnetic field component.
Figure 9A:
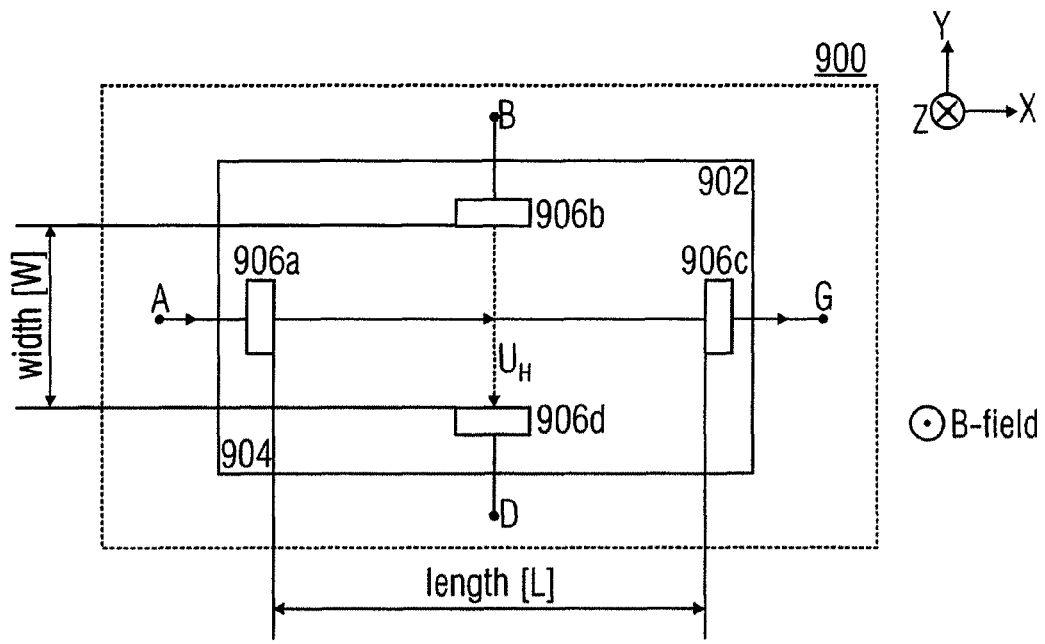
FIG. 9a is the schematic structure of a conventional horizontal Hall sensor element.
Figure 9B:
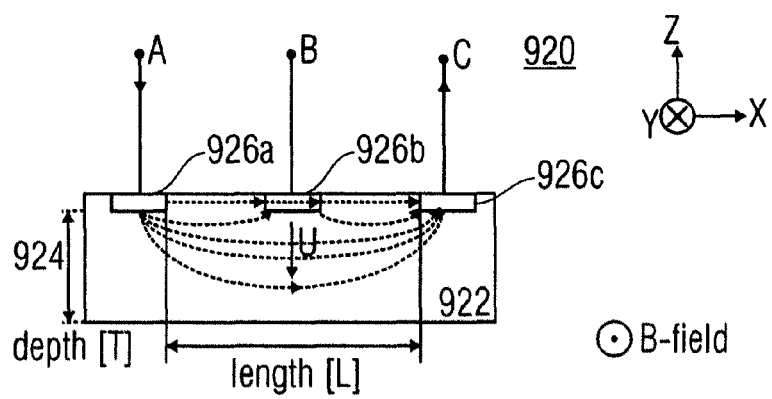
FIG. 9b is the schematic structure of a conventional vertical Hall sensor element.
Figure 10:
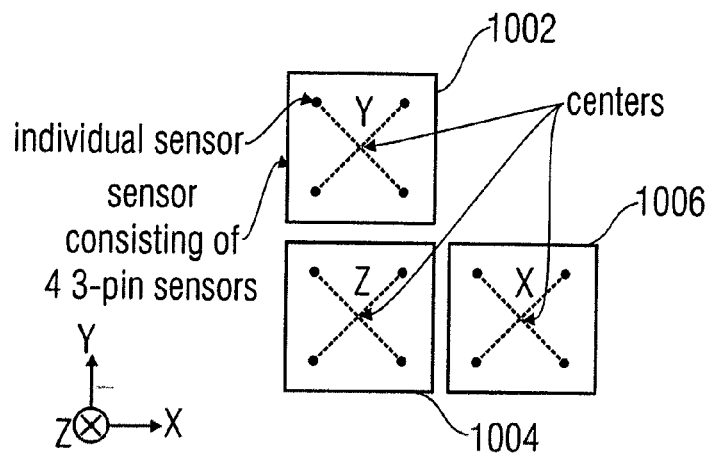
FIG. 10 is a schematic conventional arrangement of individual sensors for spatially detecting magnetic field components.
Figure 11:
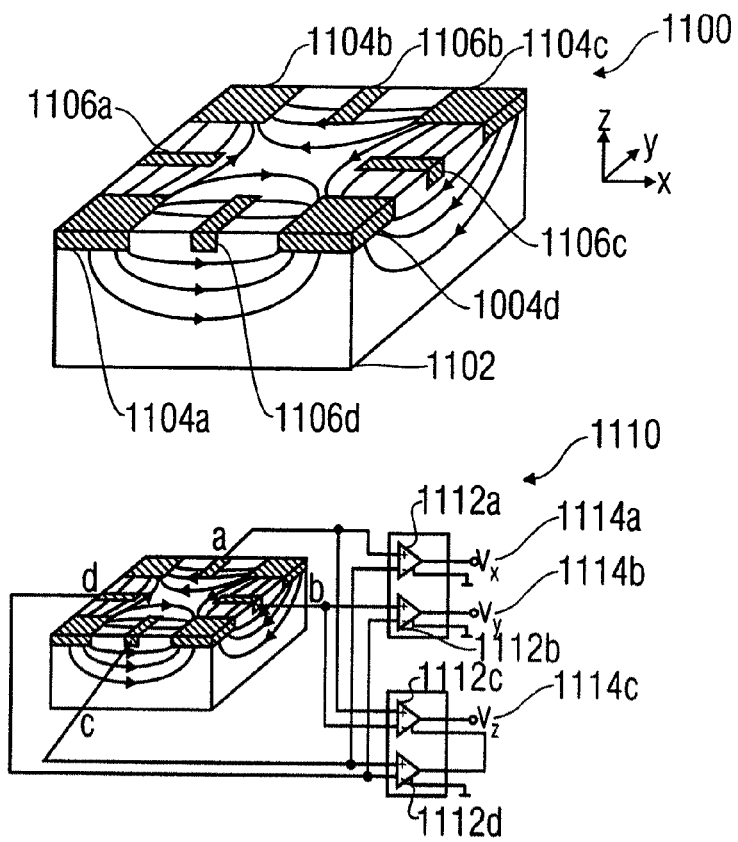
FIG. 11 is an alternative conventional 3D sensor for detecting the spatial components of a magnetic field.
Figure 12:
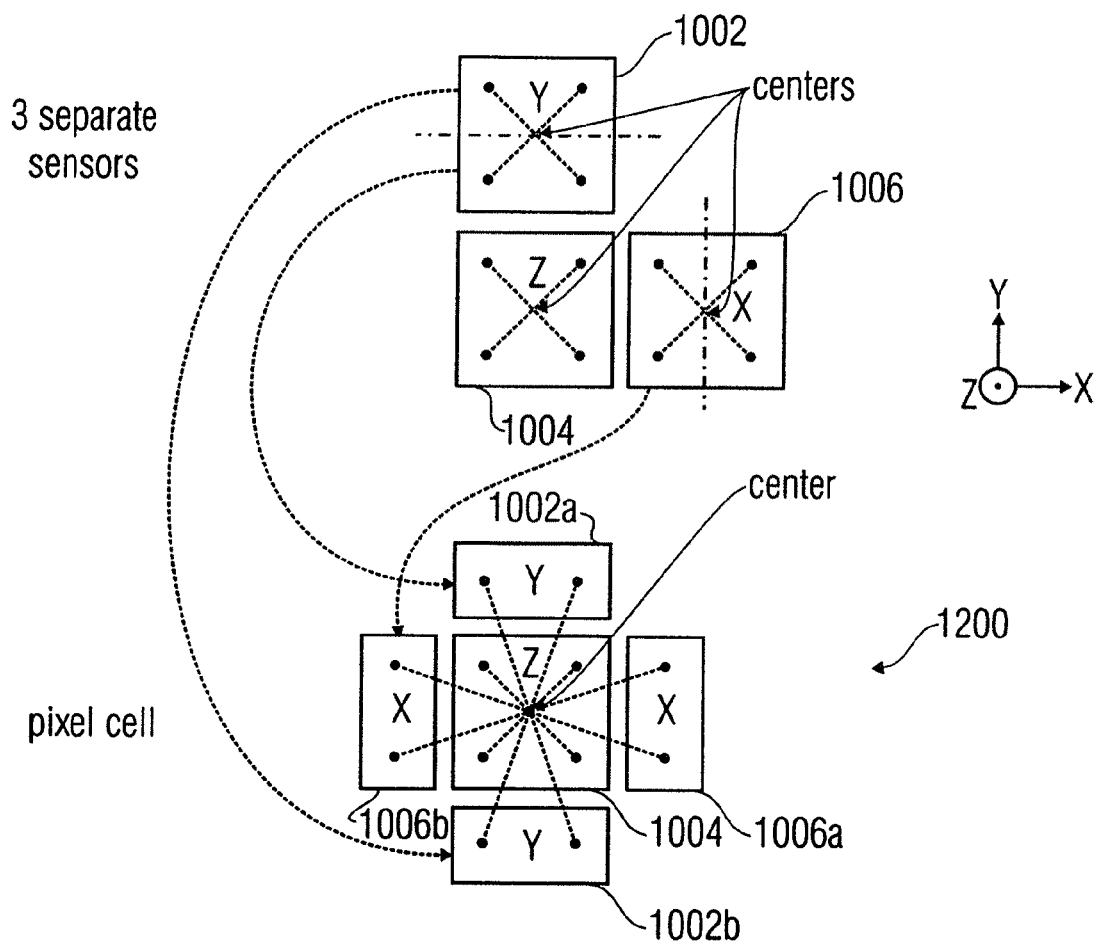
FIG. 12 is a schematic arrangement of individual Hall sensor elements for detecting a spatial magnetic field at one point.

FIG. 8 shows a further embodiment of the first sensor element arrangement 102. FIG. 8 shows an alternative embodiment wherein two horizontal Hall sensor element pairs each are placed in a square, wherein the individual horizontal Hall sensor element pairs are arranged diagonally to the reference point 101. Here, the first sensor element arrangement 102 consists overall of four horizontal Hall sensor elements 102a-d. Further, every Hall sensor element 102a-d has four contact electrodes K1-K4. In the embodiment shown in FIG. 8, the contact electrodes K1, the contact electrodes K2, the contact electrodes K3, and the contact electrodes K4 of the individual Hall sensor elements 102a-d are connected in parallel and hardwired to each other without interposed switches. In the present illustration, the contact electrodes K1 and the contact electrodes K3 of the Hall sensor elements 102a-d form the current impression contacts, whereas the contact electrodes K2 and the contact electrodes K4 of the Hall sensor elements 102a-d provide the measurement terminals for detecting a Hall voltage. The contact electrodes for supplying an operating current and the contact electrodes for detecting a Hall voltage are arranged in the individual Hall sensor elements, such that the current direction of the impressed operating current is respectively perpendicular to the direction of the tapped Hall voltage.

In the present arrangement, the operating current directions in the two Hall sensor elements of every Hall sensor element pair, which means 102a and 102d or 102b and 102c, respectively, are each rotated by 90° to each other. The current directions of the second Hall sensor element pair are offset at an angle of 45° with regard to the current directions of the first Hall sensor element pair.

In the practical implementation of the inventive Halls sensor arrangement, the angle by which the operating current directions in the two Hall sensor elements of every pair are rotated to each other can deviate from the ideal value of 90°, and can be, for example, in a range of, e.g., between 80° and 100°, wherein the angles in this range can be considered as angles of substantially 90° in terms of the present embodiment. The hardwired contact electrodes K1, K2, K3, and K4 of the Hall sensor elements 102a-d are connected to switches S1, S2, S3 and S4 that can each be switched between four positions, i.e. between the contact electrodes K1, K2, K3, and K4. With the switches S1 to S4, the contact electrodes K1 to K4 can be switched together as supply terminals for supplying an operating current $I_B$, or as measurement terminals for detecting a Hall voltage $U_H$ in the individual measurement phases of the Hall sensor arrangement. Thus, switching the switches makes a spinning current method within the first sensor element arrangement 102 possible.

In principle, further embodiments are possible as well. A further embodiment of a Hall sensor arrangement that is not explicitly illustrated here can, for example, be that more than two pairs of Hall sensor elements are used. This applies as well with regard to the vertical Hall sensor element arrangements that are generally also not limited to the usage of two or four Hall sensor elements. Even in the case that more Hall sensors are used, the current directions in the two Hall sensor elements of every pair can each be substantially offset to each other by 90° as it is also the case in the embodiment of FIG. 8. Here, the two Hall sensor elements of one pair also have to be geometrically equal and closely adjacent with regard to the dimension of the Hall sensor elements and can be arranged below, next to, or diagonally to each other in the overall sensor arrangement. With regard to the geometry of the arrangement, a measure of symmetry around the reference point to be measured is necessitated within certain tolerance ranges. The current directions of the at least two Hall sensor element pairs are each rotated to each other and by an angle of 90°/n, wherein n is the number of all used Hall sensor element pairs, wherein n>2. If, for example, three Hall sensor elements are used, the current directions in the individual Hall sensor element pairs will be offset by an angle of substantially 30°. The sensor element pairs of the sensor arrangement are arranged either next to each other, or in the secondary diagonal, wherein the Hall sensor elements are in pairs as close as possible to each other.

In summary, it can be stated with regard to the inventive concept of the magnetic 3D point sensor calibratable during measurement operation that magnetic sensors according to the embodiments of the present invention also necessitate only a single excitation conductor. They offer the advantage that all three field components can be measured in very good approximation at one point, wherein offsets are caused, for example, by device tolerances, contaminations in the semiconductor material, structure inhomogeneties in the semiconductor material, etc., can be compensated, for example, by the spinning current principle, and that the measurement values can then be provided with little offset. By using the excitation loop that can have an arbitrary number of windings, a simple wafer-test, which means an on-chip-test of all three sensors becomes possible. Further, by combining the measurement signals from the individual measurement phases, it is possible to allow a self-test during the running measurement operation, since both measurement signal portions attributable to the measurement field components and measurement signal portions attributable to calibration field components can be significantly reduced. Thus, it is possible to perform sensitivity calibration at such a magnetic field sensor during operation. The excitation loop itself can also be tested, since a failure of all three sensors with separate evaluation electronic is very unlikely.

Further, it should be noted that the present invention has been explained using the example of vertical 3-pin-Hall sensors, but the same is generally not limited to these. For example, 5-pin-Hall sensors (see, e.g., DE 101 50 955 and DE 101 50 950) or generally any sensors can be used, wherein circular or circular-segment shaped arrangements are also possible. With regard to the geometry of the magnetic field sensor, the used sensor element arrangements should each detect the magnetic field at a common reference point, which can substantially be obtained by symmetrical arrangements in pairs around the reference point analogously to the above specification. The measurement method, which means the compensation method and the calibration method is then to be adapted to the respective Hall sensors and their geometry.

It should particularly be noted that depending on the circumstances, the inventive scheme can also be implemented in software. The implementation can be performed on digital memory media, particularly a disc, or a CD with electronically-readable control signals that can cooperate with a programmable computer system and/or micro-controller such that the respective method is performed. Generally, the invention also consists of a computer program product with a program code for performing the inventive method stored on a machine-readable carrier when the computer program product runs on a computer and/or micro-controller. In other words, the invention can also be realized as a computer program with a program code for performing the method, when the computer program runs on a computer and/or micro-controller.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A magnetic field sensor calibratable during measurement operation for detecting first, second, and third spatial components $B_z$, $B_y$, and $B_x$ of a magnetic field at a reference point, wherein the magnetic field comprises at least one of measurement field components and calibration field components, wherein the measurement field components comprise first, second, and third measurement field components $B_{Mz}$, $B_{My}$, and $B_{Mx}$, and wherein the calibration field components comprise first, second, and third calibration field components $B_{Kz}$, $B_{Ky}$, and $B_{Kx}$, comprising:

a first sensor element arrangement for detecting the first magnetic field component $B_z$ comprising at least one of a first measurement field component $B_{Mz}$ and a first calibration field component $B_{Kz}$, with respect to a first spatial axis z at the reference point;

a second sensor element arrangement for detecting the second magnetic field component $B_y$ comprising at least one of a second measurement field component $B_{My}$ and a second calibration field component $B_{Ky}$, with respect to a second spatial axis y at the reference point;

a third sensor element arrangement for detecting the third magnetic field component $B_x$ comprising at least one of a third measurement field component $B_{Mx}$ and a third calibration field component $B_{Kx}$, with respect to a third spatial axis x at the reference point; and an excitation line arranged such with respect to the first, second, and third sensor element arrangements that when impressing a predetermined current into the excitation line, a first predetermined calibration field component $B_{Kz}$ with respect to the first spatial axis x in the first sensor element arrangement is generated, a second predetermined calibration field component $B_{Ky}$ with respect to the second spatial axis y in the second sensor element arrangement is generated, and a third predetermined calibration field component $B_{Kx}$ with respect to the third spatial axis x in the third sensor element arrangement is generated, wherein the three spatial axes z, y, and x run along linearly independent position vectors.

2. The magnetic field sensor according to claim 1, wherein the first, second and third sensor element arrangements is operable in a plurality of operating phases, wherein each of the first, second, and third sensor element arrangements is implemented to provide, in every operating phase, a measurement signal attributable to the operating phase.

3. The magnetic field sensor according to claim 2, wherein each of the first, second and third sensor element arrangements is implemented to provide the measurement signals attributed to the operating phases, wherein the measurement signals attributed to the operating phases are combinable to a first total measurement value by a first linear combination, such that the influence of the measurement field component in the first total measurement value is reduced, or the measurement signals attributed to the operating phases are combinable to a second total measurement value by a second linear combination, such that the influence of the calibration field component in the second total measurement value is reduced.

4. The magnetic field sensor according to claim 3, wherein the measurement signals attributed to the operating phases are combinable to a first total measurement value by a first linear combination, such that the influence of the measurement field component in the first total measurement value is reduced to less than 10%, 1%, or 0.1% of the first total measurement value.

5. The magnetic field sensor according to claim 3, wherein the measurement signals attributed to the operating phases are combinable to a second total measurement value by a second linear combination, such that the portion of the calibration field component in the second total measurement value is reduced to less than 10%, 1%, or 0.1% of the second total measurement value.

6. The magnetic field sensor according to claim 1, wherein the first sensor element arrangement comprises a Hall sensor element horizontal with respect to a main surface of the magnetic field sensor.

7. The magnetic field sensor according to claim 1, wherein the first sensor element arrangement comprises a plurality of Hall sensor elements horizontal with respect to a main surface of the magnetic field sensor, wherein the geometrical arrangement of the plurality of horizontal Hall sensor elements is symmetrical in pairs with respect to the reference point and the Hall sensor elements are coupled to each other such that the magnetic field component are detectable in an offset-compensated manner.

8. The magnetic field sensor according claim 1, wherein the second sensor element arrangement comprises at least two Hall sensor elements vertical with respect to a main surface of the magnetic field sensor, wherein the geometrical arrangement of the at least two vertical Hall sensor elements is symmetrical in pairs with respect to the reference point, and that are coupled to each other such that the magnetic field component are detectable in an offset-compensated manner.

9. The magnetic field sensor according to claim 1, wherein the third sensor element arrangement comprises at least two Hall sensor elements vertical with respect to a main surface of the magnetic field sensor, wherein the geometrical arrangement of the at least two vertical Hall sensor elements is symmetrical in pairs with respect to the reference point, and that are coupled to each other such that the magnetic field component are detectble in an offset-compensated manner.

10. The magnetic field sensor according to claim 1, wherein the first, second and third sensor element arrangements are operable in the spinning current mode.

11. A method for calibrating a magnetic field sensor during measurement operation by detecting first, second, and third spatial components $B_z$, $B_y$ and $B_x$ of a magnetic field at a reference point, wherein the magnetic field comprises at least one of measurement field components and calibration field components, wherein the measurement field components comprise first, second, and third measurement field components $B_{Mz}$, $B_{My}$, $B_{Mx}$ and wherein the calibration field components comprise first, second, and third calibration field components $B_{Kz}$, $B_{Ky}$ and $B_{Kx}$, comprising:

detecting the first magnetic field component $B_z$ comprising at least one of a first measurement field component $B_{Mz}$ and a first calibration field component $B_{Kz}$ with respect to the first spatial axis z at the reference point;

detecting the second magnetic field component $B_y$ comprising at least one of a second measurement field component $B_{My}$ and a second calibration field component $B_{Ky}$ with respect to the second spatial axis y at the reference point;

detecting the third magnetic field component $B_x$ comprising at least one of a third measurement field component $B_{My}$ and a third calibration field component $B_{Kx}$ with respect to the third spatial axis x at the reference point; and generating the first, second, and third calibration field components $B_{Kz}$, $B_{Ky}$ and $B_{Kx}$ with respect to the first, second, and third spatial axes z, y and x, wherein the first, second, and third spatial axes run along a linearly independent position vector.

12. The method according to claim 11, wherein the steps of detecting are repeated during a plurality of operating phases, wherein measurement signals attributed to the first magnetic field component $B_z$, to the second magnetic field component $B_y$, and to the third magnetic field component $B_x$ in the operating phases are detected.

13. The method according to claim 11, further comprising first linearly combining the measurement signals of a magnetic field component attributed to the operating phases to a first total measurement value, such that the influence of the measurement field component in the first total measurement value is reduced, or second linearly combining the measurement signals of a magnetic field component attributed to the operating phases to a second total measurement value, such that the influence of the measurement field component in the second total measurement value is reduced.

14. The method according to claim 13, wherein first linearly combining the measurement signals of a magnetic field component attributed to the operating phases to a first total measurement value is performed such that a portion of the measurement field component in the first total measurement value is reduced to less than 10%, 1%, or 0.1% of the first total measurement value.

15. The method according to claim 13, wherein second combining the measurement signals of a magnetic field component attributed to the operating phases to a second total measurement value is performed such that the portion of the calibration field component in the second total measurement value is reduced to less than 10%, 1%, or 0.1% of the second total measurement value.

16. The method according to claim 11, further comprising combining the measurement signals of a magnetic field component attributed to the operating phases, such that the magnetic field component are detectable in an offset-compensated manner.

17. The method according to claim 11, wherein the operating phases are implemented according to a spinning current method.

18. The method according to claim 11, further comprising:
  storing excitation current strengths, measurement field components, or calibration field components for calibration;
  attributing the excitation current strength to the calibration field components or magnetic field strengths, respectively; and
  providing value pairs of measurement field components and magnetic field strengths.

19. A non-transitory computer readable medium product having stored thereon instructions that when read by a processor cause the processor to execute a method for calibrating a magnetic field sensor during measurement operation by detecting first, second, and third spatial components Bz, By and Bx of a magnetic field at a reference point, wherein the magnetic field comprises at least one of measurement field components and calibration field components, wherein the measurement field components comprise first, second, and third measurement field components BMz, BMy, BMx and wherein the calibration field components comprise first, second, and third calibration field components BKz, BKy and BKx, the method comprising:
  detecting the first magnetic field component Bz comprising at least one of a first measurement field component BMz and a first calibration field component BKz with respect to the first spatial axis z at the reference point;
  detecting the second magnetic field component By comprising at least one of a second measurement field component BMy and a second calibration field component BKy with respect to the second spatial axis y at the reference point;
  detecting the third magnetic field component Bx comprising at least one of a third measurement field component BMy and a third calibration field component BKx with respect to the third spatial axis x at the reference point; and
  generating the first, second, and third calibration field components BKz, BKy and BKx with respect to the first, second, and third spatial axes z, y and x, wherein the first, second, and third spatial axes run along a linearly independent position vector.

\* \* \* \* \*